(12) United States Patent
Leber et al.

(10) Patent No.: US 12,034,098 B2
(45) Date of Patent: Jul. 9, 2024

(54) OPTOELECTRONIC COMPONENT HAVING A DIELECTRIC REFLECTIVE LAYER AND PRODUCTION METHOD FOR SAME

(71) Applicant: OSRAM Opto Semiconductors GmbH, Regensburg (DE)

(72) Inventors: Andreas Leber, Regensburg (DE); Siegfried Herrmann, Neukirchen (DE); Christine Rafael, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 268 days.

(21) Appl. No.: 17/279,632

(22) PCT Filed: Sep. 26, 2019

(86) PCT No.: PCT/EP2019/076077
§ 371 (c)(1),
(2) Date: Mar. 25, 2021

(87) PCT Pub. No.: WO2020/064947
PCT Pub. Date: Apr. 2, 2020

(65) Prior Publication Data
US 2021/0391506 A1  Dec. 16, 2021

(30) Foreign Application Priority Data
Sep. 27, 2018 (DE) .................... 10 2018 123 932.7

(51) Int. Cl.
*H01L 33/36* (2010.01)
*H01L 33/38* (2010.01)
(Continued)

(52) U.S. Cl.
CPC .............. *H01L 33/36* (2013.01); *H01L 33/38* (2013.01); *H01L 33/387* (2013.01); *H01L 33/46* (2013.01);
(Continued)

(58) Field of Classification Search
CPC ......... H01L 33/36; H01L 33/38; H01L 33/46; H01L 33/387; H01L 33/60; H01L 33/62;
(Continued)

(56) References Cited

U.S. PATENT DOCUMENTS

2015/0008465 A1  1/2015 Saenger Nayver et al.
2015/0263241 A1  9/2015 Akiyama et al.
(Continued)

FOREIGN PATENT DOCUMENTS

EP    2669962 A2    12/2013

OTHER PUBLICATIONS

International search report, issued for the corresponding PCT application No. PCT/EP2019/076077, dated Dec. 13, 2019, 2 pages (for informational purposes only).

*Primary Examiner* — Feifei Yeung Lopez
(74) *Attorney, Agent, or Firm* — VIERING, JENTSCHURA & PARTNER mbB

(57) ABSTRACT

An optoelectronic device includes an optoelectronic semiconductor chip having a first and a second semiconductor layer having a first and second conductivity type, respectively; a first and a second current spreading layer; a dielectric reflective layer; and a plurality of first electrical connecting elements. The first semiconductor layer and the second semiconductor layer are stacked. The first current spreading layer and the second current spreading layer are arranged on a side of the first semiconductor layer facing away from the second semiconductor layer. The dielectric reflective layer is arranged between the first semiconductor layer and the first current spreading layer. The plurality of first electrical connecting elements extends through the dielectric reflective layer and is suitable to electrically connect the first semiconductor layer to the first current
(Continued)

spreading layer. The second current spreading layer is electrically connected to the second semiconductor layer.

18 Claims, 13 Drawing Sheets

(51) Int. Cl.
    *H01L 33/46*           (2010.01)
    *H01L 33/60*           (2010.01)
    *H01L 33/62*           (2010.01)

(52) U.S. Cl.
    CPC .............. *H01L 33/60* (2013.01); *H01L 33/62* (2013.01); *H01L 2933/0016* (2013.01); *H01L 2933/0025* (2013.01); *H01L 2933/0058* (2013.01); *H01L 2933/0066* (2013.01)

(58) Field of Classification Search
    CPC ..... H01L 2933/0016; H01L 2933/0058; H01L 2933/0066
    See application file for complete search history.

(56) References Cited

U.S. PATENT DOCUMENTS

| | | | |
|---|---|---|---|
| 2016/0260869 A1* | 9/2016 | Jeon | ................. H01L 33/38 |
| 2017/0186916 A1 | 6/2017 | Shioji et al. | |
| 2017/0186917 A1* | 6/2017 | Jeon | ................. H01L 33/08 |
| 2017/0236977 A1 | 8/2017 | Oh et al. | |
| 2017/0287789 A1* | 10/2017 | Bower | ................. H01L 22/12 |
| 2017/0288088 A1 | 10/2017 | Won Cheol et al. | |
| 2021/0066549 A1* | 3/2021 | Liu | ................. H01L 33/14 |

\* cited by examiner

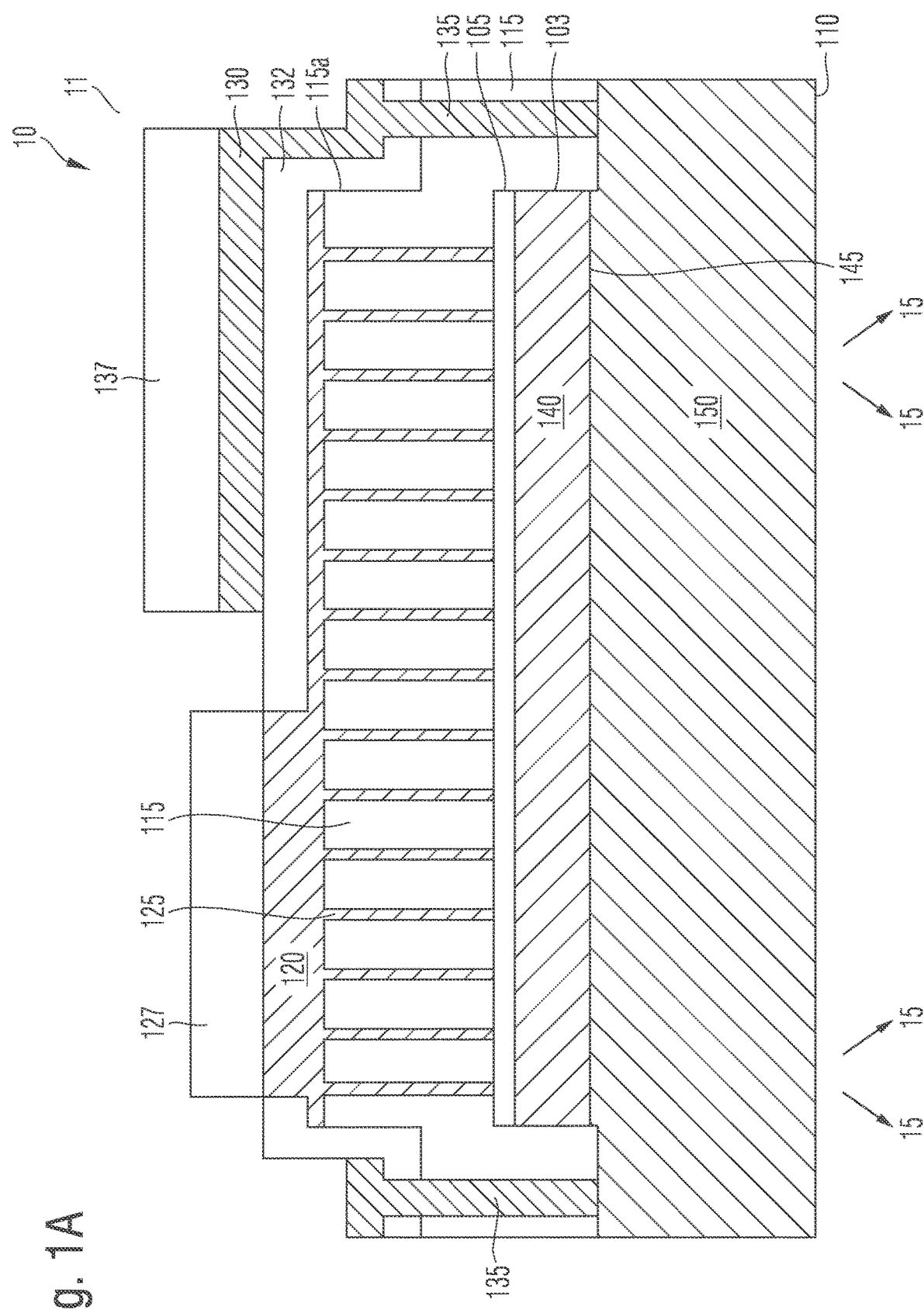

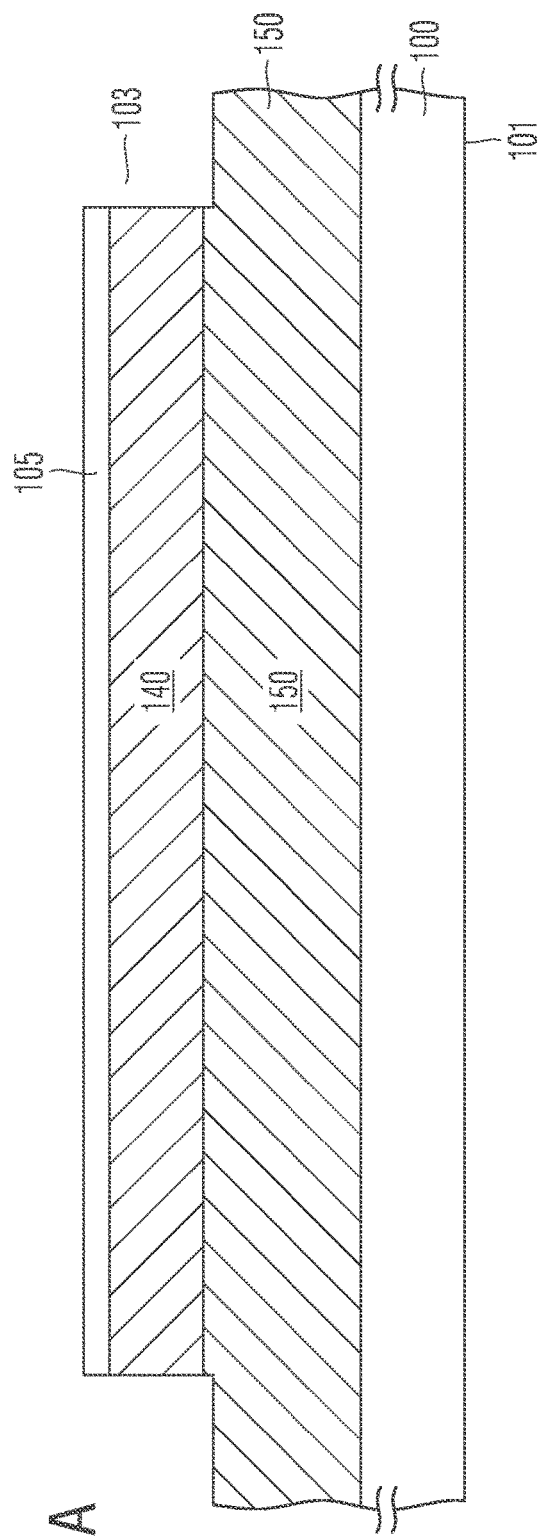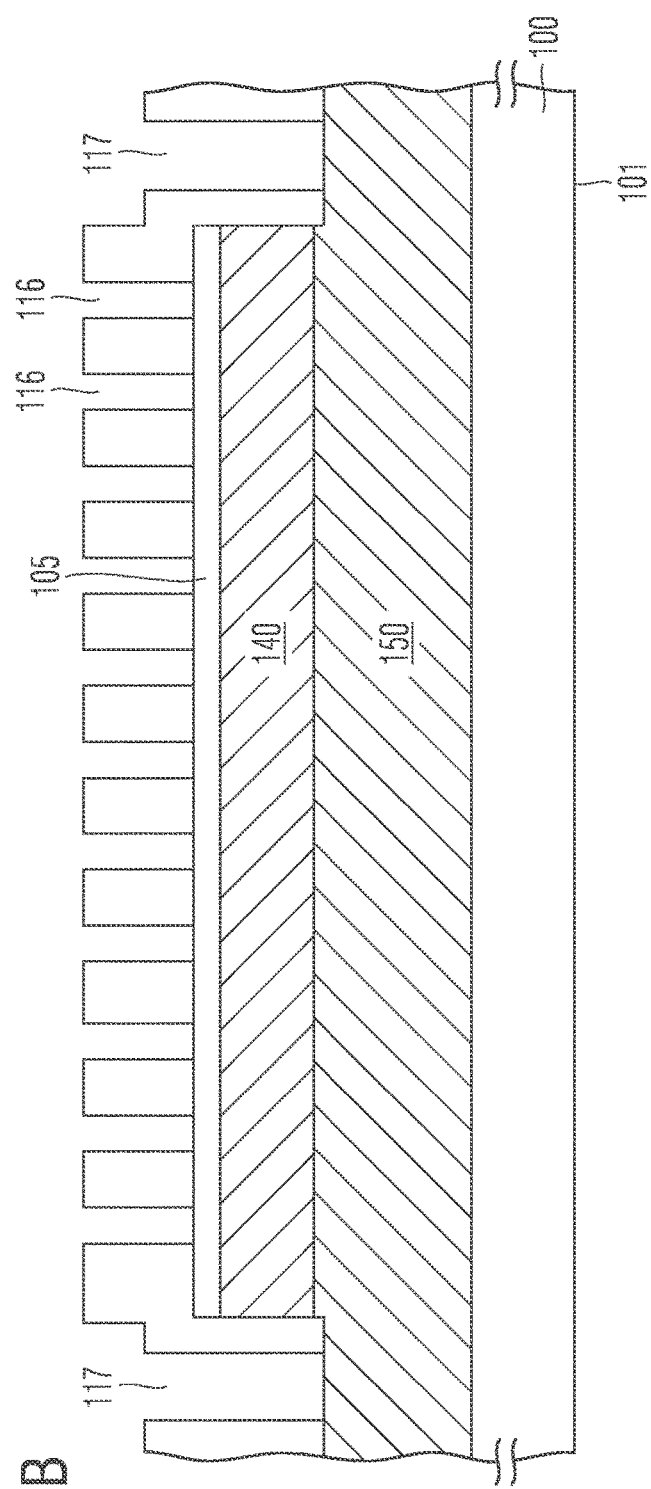

OPTOELECTRONIC COMPONENT HAVING A DIELECTRIC REFLECTIVE LAYER AND PRODUCTION METHOD FOR SAME

CROSS-REFERENCE TO RELATED APPLICATIONS

The present application is a national stage entry according to 35 U.S.C. § 371 of PCT Application No. PCT/EP2019/076077 filed on Sep. 26, 2019; which claims priority to German Patent Application Serial Nos. 10 2018 123 932.7 filed on Sep. 27, 2018; all of which are incorporated herein by reference in their entirety and for all purposes.

TECHNICAL FIELD

The disclosure relates to optoelectronic devices having optoelectronic semiconductor chips configured to emit electromagnetic radiation.

BACKGROUND

A light emitting diode (LED) is a light emitting device based on semiconductor materials. For example, an LED includes a pn junction. When electrons and holes recombine with one another in the regions of the pn junction, due, for example, to a corresponding voltage being applied, electromagnetic radiation is generated.

Electrical contacts for contacting the p- and n-type layers may lie on a side of the semiconductor layers facing away from the light emission. In general, concepts are being sought which allow such flip-chip devices to be further improved.

SUMMARY

The object of the present disclosure is to provide an improved optoelectronic device and an improved method for producing an optoelectronic device.

According to the present disclosure, the object is achieved by the subject matter and the method of the independent patent claims. Advantageous enhancements are defined in the dependent claims.

According to embodiments, an optoelectronic device includes an optoelectronic semiconductor chip which is suitable for emitting electromagnetic radiation. The optoelectronic semiconductor chip comprises a first semiconductor layer of a first conductivity type, a second semiconductor layer of a second conductivity type, first and second current spreading layers, a dielectric mirror layer, and a plurality of first electrical connecting elements. The first semiconductor layer and the second semiconductor layer are stacked one on top of the other. Electromagnetic radiation emitted by the optoelectronic semiconductor chip is output via a first main surface of the second semiconductor layer. The first current spreading layer is arranged on a side of the first semiconductor layer facing away from the second semiconductor layer. The dielectric mirror layer is arranged between the first semiconductor layer and the first current spreading layer. The plurality of first electrical connecting elements extends through the dielectric mirror layer and is suitable for electrically connecting the first semiconductor layer to the first current spreading layer. The second current spreading layer is arranged on the side of the first semiconductor layer facing away from the second semiconductor layer and is electrically connected to the second semiconductor layer.

The optoelectronic device may further comprise a plurality of second electrical connecting elements which are suitable for electrically connecting the second semiconductor layer to the second current spreading layer.

As an example, the first semiconductor layer is patterned to form a mesa, and the dielectric mirror layer is arranged over a mesa flank.

The optoelectronic semiconductor chip may further comprise an active zone between the first and second semiconductor layers, the active zone being exposed in the area of the mesa flank.

The optoelectronic may furthermore comprise a transparent substrate which is arranged on the side of the second semiconductor layer.

According to embodiments, the first current spreading layer and the second current spreading layer may each form an interdigital structure, so that an interdigital structure of the first current spreading layer is arranged between interdigital structures of the second current spreading layer. As an example, the second current spreading layer and, if appropriate, the second connecting elements may be part of a conductive carrier.

The optoelectronic device may further comprise first and second contact elements, wherein the first contact element is connected to the first current spreading layer and the second contact element is connected to the second current spreading layer. The first and second contact elements are arranged on a side of the first semiconductor layer facing away from the second semiconductor layer. As an example, the optoelectronic device may each comprise a plurality of first contact elements or a plurality of second contact elements.

The optoelectronic device may also comprise a first contact post and a second contact post, where the first contact post is connected to the first contact element and the second contact post is connected to the second contact element. As an example, the optoelectronic device may comprise a plurality of first contact posts or a plurality of second contact posts, respectively.

The optoelectronic semiconductor chip may further include a transparent conductive bonding layer in contact with the first semiconductor layer.

According to embodiments, a distance between the first connecting elements is less than 100 µm. According to embodiments, a distance between the second connecting elements is less than 700 µm.

The optoelectronic device may also include a lead frame, wherein the optoelectronic semiconductor chip is mounted onto the lead frame.

According to embodiments, a method for producing an optoelectronic device comprising an optoelectronic semiconductor chip which is suitable for emitting electromagnetic radiation comprises forming a layer stack comprising a first semiconductor layer of a first conductivity type and a second semiconductor layer of a second conductivity type. The method furthermore includes forming a dielectric mirror layer on a side of the first semiconductor layer facing away from the second semiconductor layer, forming a plurality of first electrical connecting elements which extend through the dielectric mirror layer, and forming first and second current spreading layers, each on a side of the first semiconductor layer facing away from the second semiconductor layer. The dielectric mirror layer is arranged between the first semiconductor layer and the first current spreading layer. The plurality of first electrical connecting elements is suitable for electrically connecting the first semiconductor layer to the first current spreading layer. The second current spreading layer is arranged on the side of the first semiconductor layer facing away from the second semiconductor layer and is electrically connected to the second semiconductor layer.

The method may furthermore comprise forming a plurality of second electrical connecting elements. The plurality of second electrical connecting elements is suitable for electrically connecting the second semiconductor layer to the second current spreading layer. As an example, the second electrical connecting elements may be formed in the dielectric mirror layer. According to further embodiments, the second current spreading layer may be connected to the second semiconductor layer in another way.

The method may further includes patterning the first semiconductor layer to form a mesa prior to forming the dielectric mirror layer, wherein the dielectric mirror layer is formed over a mesa flank.

As an example, forming the first connecting elements and the first current spreading structure may comprise forming first openings in the dielectric mirror layer and forming a metallic layer.

The method may further include mounting the optoelectronic semiconductor chip onto a lead frame and applying a potting compound between the optoelectronic semiconductor chip and lead frame.

The method may furthermore comprise introducing a reflective element between the optoelectronic semiconductor chip and the potting compound.

According to further embodiments, an optoelectronic device comprises an optoelectronic semiconductor chip which is suitable for emitting electromagnetic radiation. The optoelectronic semiconductor chip comprises a first semiconductor layer of a first conductivity type, a second semiconductor layer of a second conductivity type, and a plurality of first and second contact elements. The first semiconductor layer and the second semiconductor layer are stacked on top of one another. Electromagnetic radiation emitted by the optoelectronic semiconductor chip is output via a first main surface of the second semiconductor layer. The plurality of first contact elements is electrically connected to the first semiconductor layer, and the plurality of second contact elements is electrically connected to the second semiconductor layer. The plurality of first and second contact elements is arranged on a side of the first semiconductor layer facing away from the second semiconductor layer.

BRIEF DESCRIPTION OF THE DRAWINGS

The accompanying drawings serve to provide an understanding of non-limiting embodiments. The drawings illustrate non-limiting embodiments and, together with the description, serve for explanation thereof. Further non-limiting embodiments and many of the intended advantages will become apparent directly from the following detailed description. The elements and structures shown in the drawings are not necessarily shown to scale relative to each other. Like reference numerals refer to like or corresponding elements and structures.

FIG. 1A shows a schematic cross-sectional view of parts of an optoelectronic semiconductor chip according to embodiments.

FIGS. 3A to 3F show cross-sectional views of a workpiece during the production of an optoelectronic semiconductor chip.

DETAILED DESCRIPTION

Figure 1B:
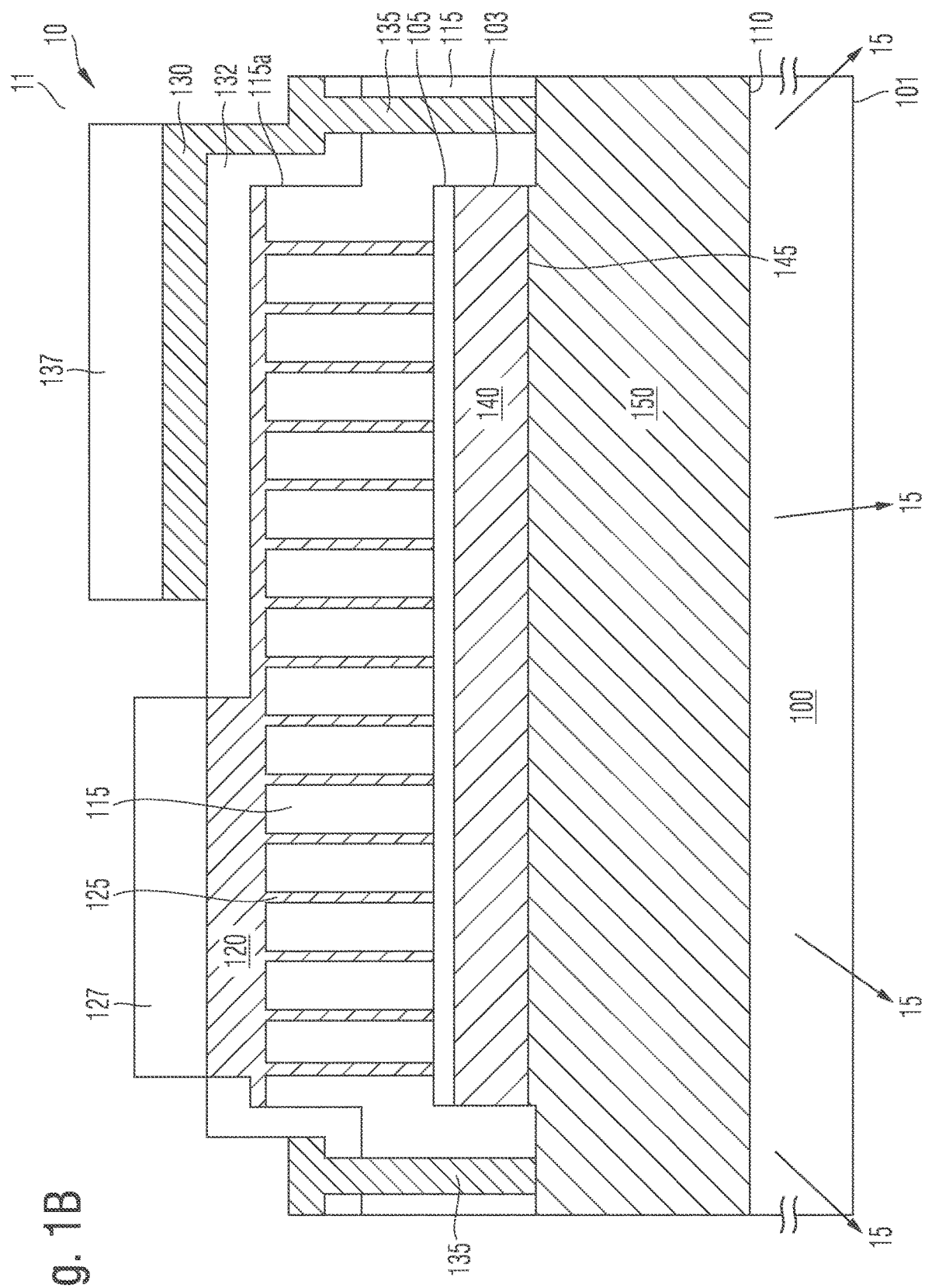
FIG. 1B shows a schematic cross-sectional view of parts of an optoelectronic semiconductor chip according to further embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, phosphide semiconductor compounds by means of which, for example, green or longer-wave light may be generated, such as GaAsP, AlGaInP, GaP, AlGaP, and other semiconductor materials such as AlGaAs, SiC, ZnSe, GaAs, ZnO, $Ga_2O_3$, diamond, hexagonal BN and combinations of the materials mentioned. The stoichiometric ratio of the ternary compounds may vary. Other examples of semiconductor materials may include silicon, silicon germanium, and germanium. In the context of the present description, the term "semiconductor" also includes organic semiconductor materials.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The term "vertical" as used in this description is intended to describe an orientation which is essentially perpendicular to the first surface of the semiconductor substrate or semiconductor body.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1A shows a cross-sectional view of components of an optoelectronic semiconductor chip 11 which is part of an optoelectronic device 10. The optoelectronic semiconductor chip 11 shown in FIG. 1A is suitable for emitting electromagnetic radiation 15. The optoelectronic semiconductor chip 11 comprises a first semiconductor layer 140 of a first conductivity type, for example p-type, and a second semiconductor layer 150 of a second conductivity type, for example n-type. The first and second semiconductor layers 140, 150 are stacked one on top of the other. For example, they are arranged over a suitable, for example, transparent substrate (not shown in FIG. 1A). According to further embodiments, however, the transparent substrate may be omitted, as shown in FIG. 1A. The optoelectronic semiconductor chip 11 furthermore comprises a first current spreading layer 120. The first current spreading layer 120 is connected to the first semiconductor layer 140 in an electrically conductive manner. The optoelectronic semiconductor chip 11 furthermore comprises a second current spreading layer 130. The second current spreading layer 130 is connected to the second semiconductor layer 150 in an electrically conductive manner. Electromagnetic radiation 15 emitted by the optoelectronic semiconductor chip 11 is output, for example, via a first main surface 110 of the second semiconductor layer 150.

The first current spreading layer 120 and the second current spreading layer 130 are each arranged on the side of the first semiconductor layer 140 facing away from the second semiconductor layer 150. A dielectric mirror layer is arranged between the first semiconductor layer 140 and the first current spreading layer 120. A plurality of first electrical connecting elements 125 extends through the dielectric mirror layer 115 and is suitable for electrically connecting the first semiconductor layer 140 to the first current spreading layer 120. Furthermore, a plurality of second connecting elements 135 may extend through the dielectric mirror layer 115. The second connecting elements 135 are suitable, for example, for connecting the second current spreading layer 130 to the second semiconductor layer 150. According to the embodiments shown in FIG. 1A, the second current spreading layer 130 is at a greater distance from the first semiconductor layer 140 than the first current spreading layer 120. As an example, the first current spreading layer 120 is electrically insulated from the second current spreading layer 130 by an insulating layer 132. The first and second current spreading layers 120, 130 may each be composed of aluminum or another suitable conductive material. For example, the material of the first current spreading layer 120 may also be the electrically conductive material of the first connecting elements 125. Furthermore, an electrically conductive material of the second current spreading layer 130 may be the electrically conductive material of the second connecting elements 135. The insulating layer 132 may be composed of silicon dioxide, for example. According to further embodiments, however, alternative insulating materials, such as silicon nitride, aluminum oxide, combinations of these materials or others, may also be used.

In general, the term "dielectric mirror layer" encompasses any arrangement which reflects incident electromagnetic radiation to a large degree (for example>90%) and is non-conductive. The dielectric mirror layer may, for example, be formed by a sequence of very thin dielectric layers having respectively different refractive indices. For example, the layers may alternately have a high refractive index (n>1.7) and a low refractive index (n<1.7) and may be formed as a Bragg reflector. The layer thickness may be $\lambda/4$, for example, wherein $\lambda$ indicates the wavelength of the light to be reflected in the respective medium. The layer as viewed from the incident light may have a greater layer thickness, for example $3\lambda/4$. Due to the small layer thickness and the difference in the respective refractive indices, the dielectric mirror layer provides high reflectivity and is non-conductive at the same time. The dielectric mirror layer is therefore suitable for insulating components of the semiconductor device from one another. A dielectric mirror layer may, for example, comprise 2 to 50 dielectric layers. A typical layer thickness of the individual layers may be about 30 to 90 nm, for example about 50 nm. The layer stack may furthermore include one or two or more layers which are thicker than approximately 180 nm, for example thicker than 200 nm.

The dielectric mirror layer may, for example, include alternating layers of $TiO_2$ and $SiO_2$. As an example, eight pairs of $SiO_2/TiO_2$ may each form an element. According to embodiments, two of these elements may be stacked on top of one another. A layer thickness of the dielectric mirror layer may, for example, amount to a total of several hundred nanometers, for example more than 1000 nm, for example more than 1500 nm, for example about 1800 nm.

According to embodiments, the first semiconductor layer 140 may be patterned to form a mesa. The dielectric mirror layer 115 may be arranged over a mesa flank. As a result of the dielectric mirror layer 115 being arranged between the first semiconductor layer 140 and the first current spreading layer 120, a large proportion of the electromagnetic radiation emitted by the optoelectronic semiconductor chip 11 may be reflected. By providing a plurality of first and second connecting elements 125, 135, good electrical contact between the first current spreading layer 120 and the first semiconductor layer and between the second current spreading layer 130 and the second semiconductor layer 150 may be effected. As an example, the first connecting elements 125 have a diameter of about 2 to 8 μm, for example 4 to 6 μm, for example 5 μm. The second connecting elements 135 have, for example, a diameter of about 20 to 50 μm, for example 30 to 40 μm, for example 36 μm. The distance between the first connecting elements 125 may be less than 200 μm, for example less than 100 μm, for example less than 60 μm. The distance between the second connecting elements 135 may be, for example, less than 1 mm, for example less than 0.6 mm, for example less than 0.5 mm. As an example, the number of first connecting elements 125 may be greater than the number of second connecting elements 135. According to all embodiments, the distance between the first electrical connecting elements 125 may be smaller than the distance between the second connecting elements 135. For example, the first electrical connecting elements 125 may be arranged in a central region of the optoelectronic semiconductor device. The second electrical connecting elements 135 may be arranged in an edge region of the optoelectronic semiconductor device.

According to embodiments, the distance between the second connecting elements 135 may depend on the current densities during operation of the optoelectronic device. For example, the values given above may apply to low-current devices having a current density of less than or equal to 200 mA/m². For high-current devices having a higher current density, a smaller distance between the second connecting elements may be used.

The first current spreading layer 120 is arranged, for example, over the entire surface area over the patterned first semiconductor layer 140. In other words, the first current spreading layer 120 extends in the horizontal direction approximately as far as the lateral boundaries of the first semiconductor layer 140. According to embodiments, the first current spreading layer 120 may protrude from the first semiconductor layer 140 by up to 100 nm. Furthermore, the first semiconductor layer 140 may protrude from the first current spreading layer 120 by a maximum of 100 nm.

An active zone 145 may be arranged between the first and second semiconductor layers 140, 150, for example. The active zone 145 may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these layers.

AS a result of the dielectric mirror layer 115 being arranged adjacent to the mesa flank, the active zone 145 may be insulated. Furthermore, the optoelectronic semiconductor chip 11, too is metallized in the area of the active zone 145, so that no emission takes place via the edge.

A portion of the second current spreading layer 130 may be arranged over the first current spreading layer 120. In this way, a high degree of reflection at the first and second current spreading layers 120, 130 is achieved. As an example, the electrically conductive layer that forms the second current spreading layer 130 may extend along the side wall 115a of the dielectric mirror layer 115 in the direction of the second semiconductor layer 150. In this way, the electrically conductive material of the second current spreading layer 130 forms a metallic frame, for example an aluminum frame, of the optoelectronic semiconductor chip. The combination of a dielectric mirror layer and the second connecting elements 135 at the edge of the mesa allows for the charge carriers to be impressed particularly efficiently at a greater distance from metal-absorbing current conduction paths. Furthermore, the absorber-free chip area is greatly enlarged by the specific arrangement of the first and second current spreading layers, which are each arranged over the patterned first semiconductor layer 140 over the entire surface area. In particular, large regions of the area beneath the dielectric mirror layer 115 are free of absorbent materials in the emission direction. As an example, the optoelectronic semiconductor chip 11 may be implemented without using silver. As a result of the dielectric mirror layer 115 being present in the area of the mesa edge, efficiency is increased. For example, a degree of coverage of the first current spreading layer 120 may be greater than a degree of coverage of the second current spreading layer 130.

The optoelectronic semiconductor chip 11 may further comprise a transparent conductive bonding layer 105 in contact with the first semiconductor layer 140. As an example, the transparent conductive bonding layer 105 may be composed of a transparent oxide, for example indium tin oxide, indium zinc oxide and others. As an example, the first and second semiconductor layers may each include a nitride semiconductor material, for example GaN or a compound semiconductor containing GaN.

The optoelectronic device 10 furthermore comprises first and second contact elements 127, 137. The first contact element 127 is connected to the first current spreading layer 120 in an electrically conductive manner. The second contact element 137 is connected to the second current spreading layer 130 in an electrically conductive manner.

FIG. 1B shows a cross-sectional view of the optoelectronic semiconductor chip 11 according to further embodiments. According to the embodiments shown in FIG. 1B, the optoelectronic semiconductor chip 11 further comprises a transparent substrate 100, for example a sapphire substrate. The first main surface 110 of the second semiconductor layer 150 is directly adjacent to the transparent substrate 100. Emitted electromagnetic radiation 15 may be emitted, for example, via the first main surface 101 of the transparent substrate and via side walls of the transparent substrate 100. According to embodiments, the first main surface 110 of the second semiconductor layer 150 may be roughened or patterned in order to increase the coupling-out efficiency.

Figure 2B:
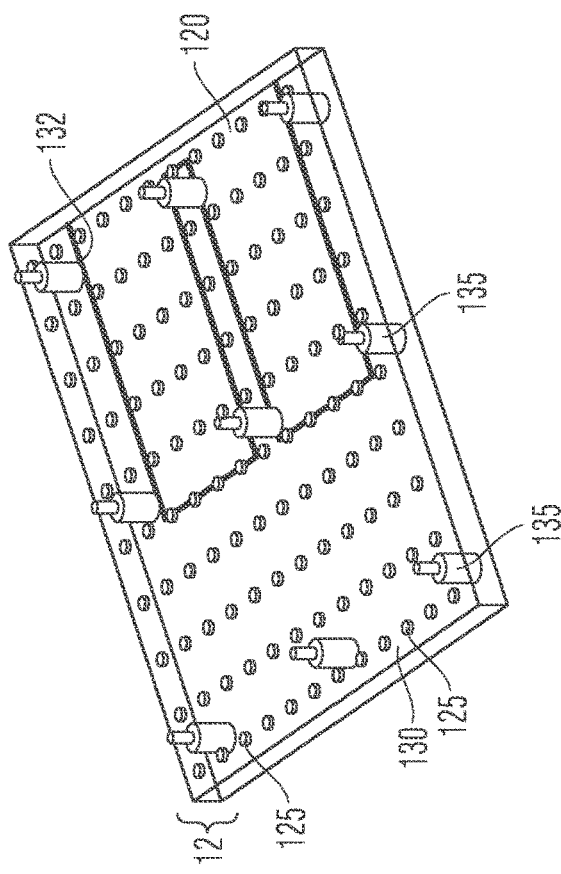
FIG. 2B shows a perspective view of a contact structure.
Figure 2A:
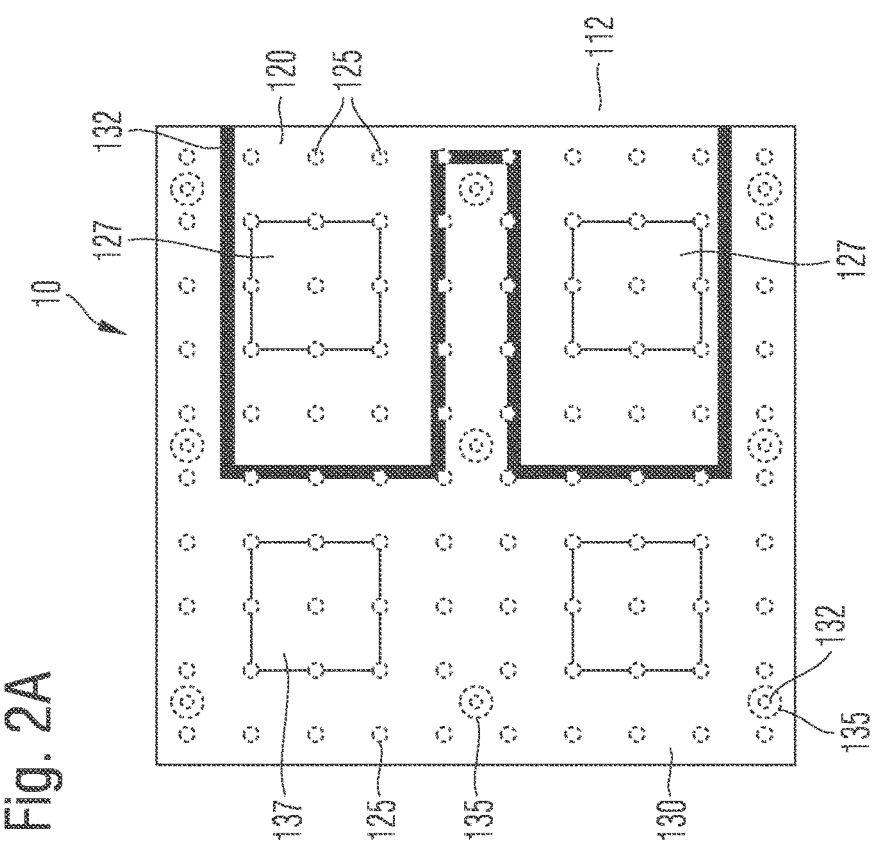
FIG. 2A shows a schematic top view of a contact structure of an optoelectronic semiconductor chip.

FIG. 2A shows a top view of a contact structure 112 which contacts each of the first and second semiconductor layers 140, 150 of the semiconductor chip 11. The term "contact structure" encompasses the first and second current spreading layers 120, 130, the first and second connecting elements 125, 135, and the first and second contact elements 127, 137.

As shown in FIG. 2A, the first current spreading layer 120 and the second current spreading layer 130 are each insulated from one another by the insulation layer 132. As an example, both the first and the second current spreading layers 120, 130 are patterned to form interdigital structures. The interdigital structures of the first current spreading layer 120 extend between adjacent interdigital structures of the second current spreading layer 130 and vice versa. In this way, an interdigital or comb structure is formed.

First contact elements 127 are each formed in contact with the first current spreading layer 120. Second contact elements 137 are each connected to the second current spreading layer 130. As illustrated in FIG. 2A, the contact structure 112 of the optoelectronic semiconductor chip 11 comprises more than one first contact element 127, in this case two. Furthermore, the contact structure 112 comprises more than two second contact elements 137, in this case two. By using this arrangement in which the first and second current spreading layers are arranged accordingly, temperature expansion effects may be efficiently absorbed. As a result, increased mechanical stability is achieved. Furthermore, it is possible to connect the contact elements 127, 137 over a large surface area, whereby thermal resistance is reduced and mechanical stability is improved. Furthermore, by providing multiple contact elements in each case, mechanical stability is increased further. In particular, temperature expansion effects may be effectively compensated for. Furthermore, due to the presence of multiple contact elements, the mechanical tension when the optoelectronic semiconductor chip is heated is compensated for in an improved manner.

According to an alternative approach, an optoelectronic device 10 comprises an optoelectronic semiconductor chip 11 which is suitable for emitting electromagnetic radiation 15.

The optoelectronic semiconductor chip 11 comprises a first semiconductor layer 140 of a first conductivity type, a second semiconductor layer 150 of a second conductivity type, and a plurality of first and second contact elements 127, 137. Furthermore, the optoelectronic device includes a first current spreading layer 120, which is connected to the first semiconductor layer. The optoelectronic device further includes a second current spreading layer 130, which is electrically connected to the second semiconductor layer 150. The first semiconductor layer 140 and the second semiconductor layer 150 are stacked one on top of the other. Electromagnetic radiation 15 emitted by the optoelectronic semiconductor chip 11 is output via a first main surface 110 of the second semiconductor layer 150. The plurality of first contact elements 127 is electrically connected to the first current spreading layer 120, and the plurality of second contact elements 137 is connected to the second current spreading layer 130. The plurality of first and second contact elements is arranged on a side of the first semiconductor layer facing away from the second semiconductor layer and on a side of the first and second current spreading layers 120, 130 facing away from the first semiconductor layer. The optoelectronic semiconductor chip 11 thus represents a flip-chip device with a plurality of first and second contact elements. The optoelectronic semiconductor chip 11 may furthermore comprise first and second current spreading layers 120, 130 as described above. The first current spreading layer 120 is connected to the first semiconductor layer 140. The first contact elements 127 are connected to the first current spreading layer 120. The second current spreading layer 130 is connected to the second semiconductor layer 150. The second contact elements 137 are connected to the second current spreading layer 130. As described above, the first and second current spreading layers 120, 130 may form an interdigital or comb structure.

FIG. 2B shows a perspective view of the connecting structure 112. The second connecting elements 135 are each connected to the second current spreading layer 130. The first connecting elements 125 are each connected to the first current spreading layer 120, which is arranged in a plane different from that of the second current spreading layer 130.

FIGS. 3A to 3F each show cross-sectional views of a work-piece during production of an optoelectronic semiconductor chip according to embodiments.

To produce the optoelectronic semiconductor chip, a second semiconductor layer 150 of the second conductivity type and a first semiconductor layer 140 of the first conductivity type are first applied over a suitable substrate, for example a transparent substrate 100. The second semiconductor layer 150 is applied to a side of the substrate 100 facing away from the first main surface 101, followed by the active zone 145 and the first semiconductor layer 140. Furthermore, a transparent conductive layer 105, for example made of indium tin oxide, may be formed over the first semiconductor layer. The first semiconductor layer 140 and, if needed, the transparent conductive layer 105 are then patterned by suitable methods, as a result of which a mesa 103 is formed. For example, a portion of the active zone 145 may be exposed by this patterning process, i.e. a portion of the active zone 145 is not covered in the area of the mesa edge.

FIG. 3A shows a cross-sectional view of an example of a resulting structure. In a next step, the dielectric mirror layer is applied. For example, the dielectric mirror layer 115 may have a layer thickness of several hundred nanometers, for example more than 500 nm, for example approximately 550 to 580 nm. First openings 116 are then formed. If necessary, second openings 117 are also formed. As an example, the first openings 116 may extend as far as the transparent conductive layer 105. As an example, the first openings 116 have a diameter of approximately 2 to 8 μm, for example 4 to 6 μm, for example 5 μm. The second openings 117 may have a diameter of approximately 20 to 50 μm, for example 30 to 40 μm, for example 36 μm. The distance between the first openings 116 may be, for example, less than 200 μm, for example less than 100 μm, for example less than 60 μm. The distance between the second openings 117 may for example be smaller than 1 mm, for example smaller than 0.6 mm, for example smaller than 0.5 mm.

Figure 3C:
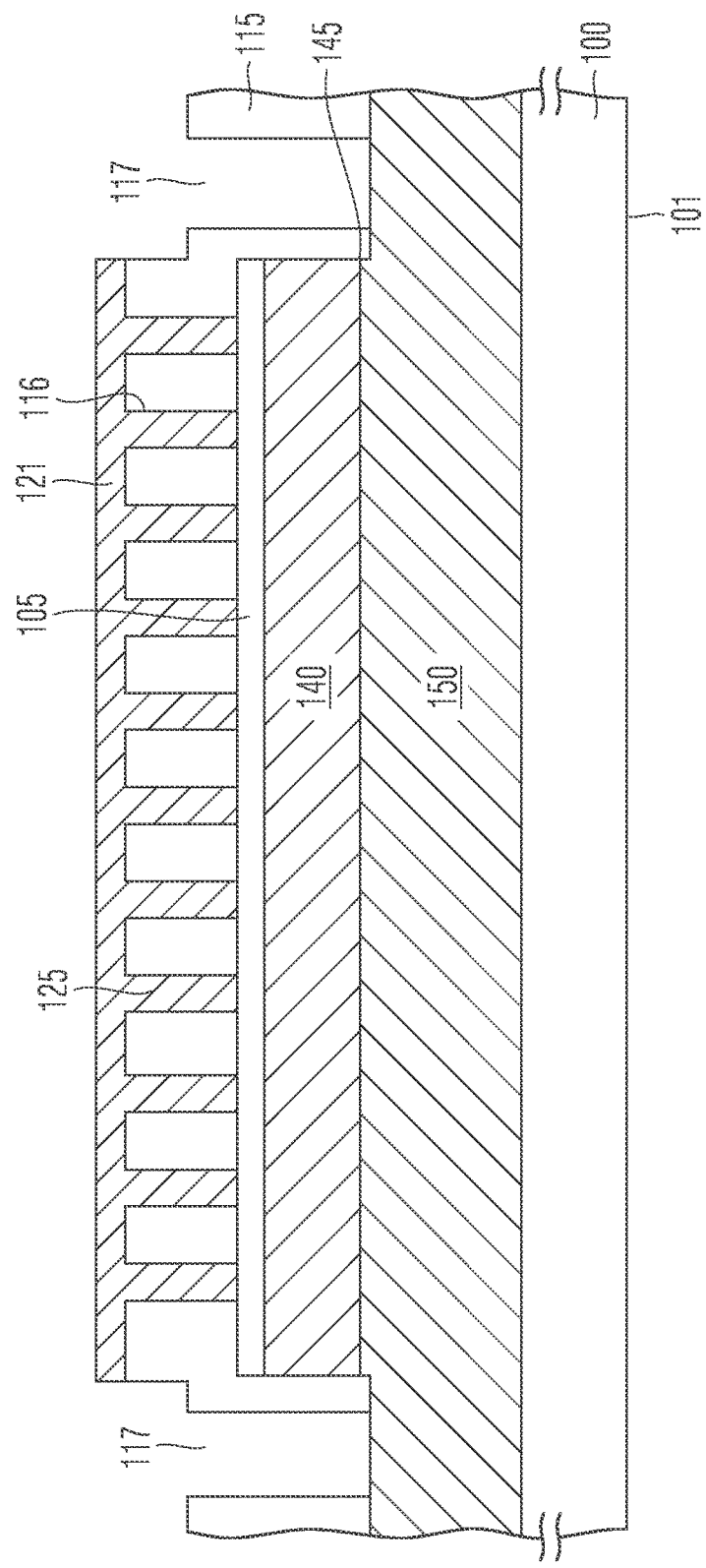

FIG. 3B shows a cross-sectional view of a resulting workpiece. In a next step, a portion of the upper surface is covered by a suitable photoresist material, wherein the region arranged above the first semiconductor layer 140 is not covered. On the exposed region, as illustrated in FIG. 3C, a first conductive layer is then deposited, for example by sputtering, optionally followed by a lift-off process. The first conductive layer 121 on the one hand fills the first openings 116 and thus forms the first connecting elements 125. Furthermore, a portion of the first current spreading layer is formed by the first conductive layer 121, for example an aluminum layer.

Figure 3D:
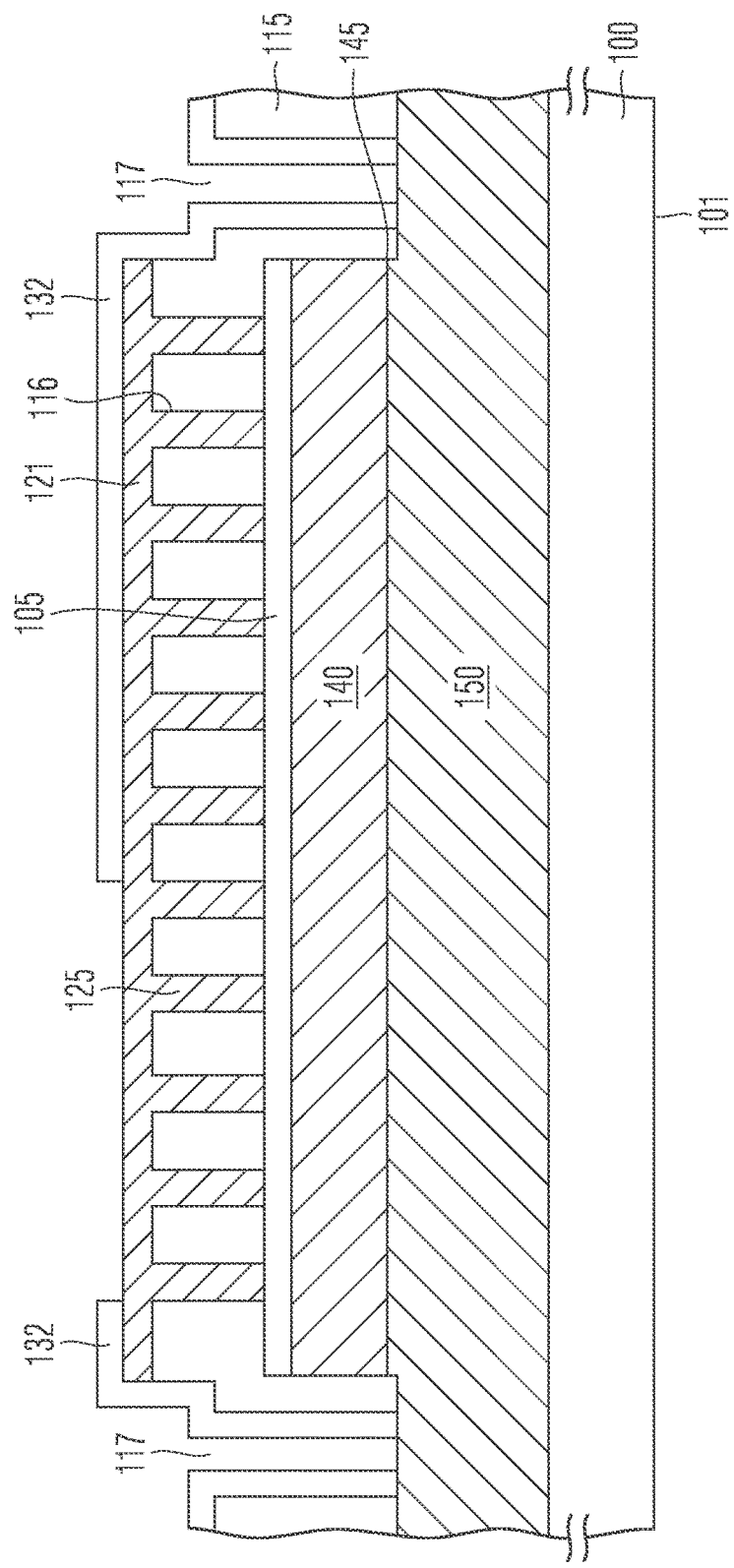

As illustrated in FIG. 3D, an insulation layer 132, for example made of $SiO_2$, is then deposited over the entire surface area. The $SiO_2$ layer covers the first conductive layer 121 on the one hand and furthermore side walls of the second openings 117. A portion of the insulation layer 132 is removed from portions of the first conductive layer 121 by a further photolithographic process. As an example, the first contact element will be formed on these portions in a later process stage.

Figure 3E:
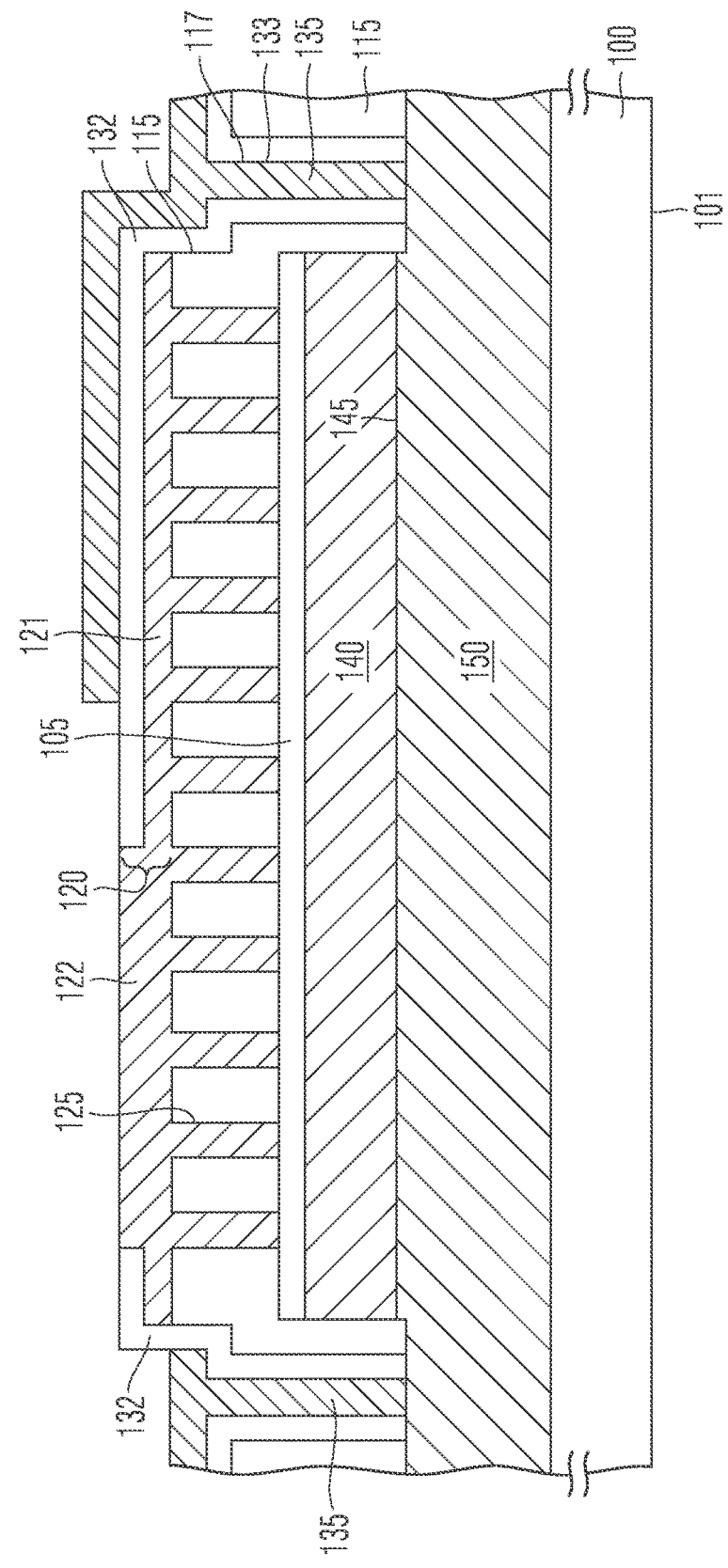

A further photoresist material is then applied and suitably patterned so that the regions on which a second conductive layer is to be formed are exposed. The second conductive layer 122 is then deposited. After removing the photoresist material, as illustrated in FIG. 3E, a portion of the second conductive layer 122 is arranged in contact with the first conductive layer 121 and thus forms part of the first current spreading layer 120. A further portion of the second conductive layer 122 is arranged above the insulation layer 132 and forms the second current spreading layer 130. Furthermore, according to embodiments, the portion of the conductive layer which is arranged in the second contact openings 117 forms the second connecting elements 135. A further portion of the second conductive layer 122 extends along the side wall 115a of the dielectric mirror layer 115 and forms a support element of the semiconductor chip.

Figure 3F:
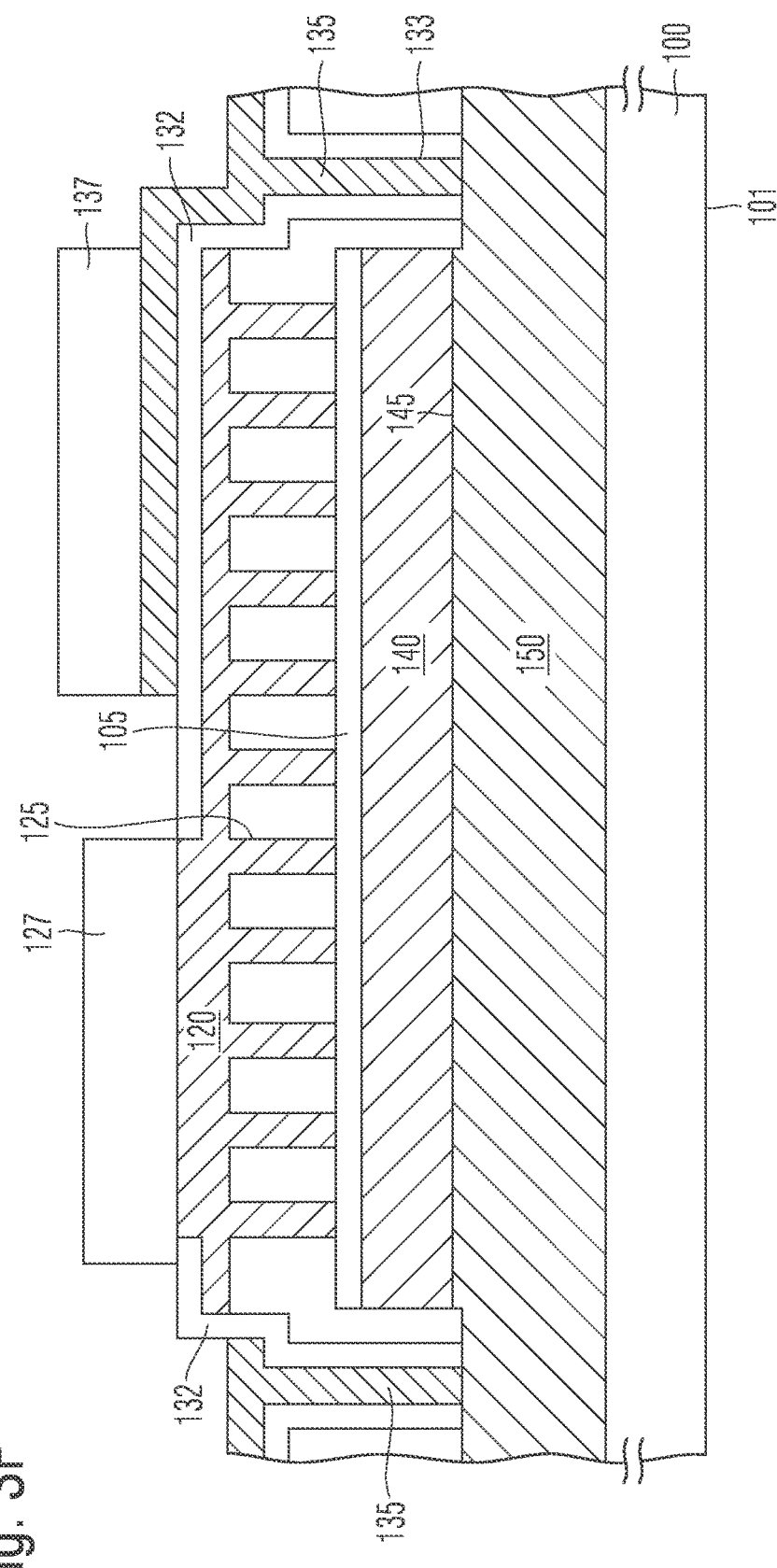

A further photolithographic method is then carried out to define the regions in which the first and second contact elements 127, 137 are each to be formed. A photoresist layer is deposited and suitably patterned. Then the metal for the contact elements 127, 137 is sputtered. Examples of materials include Ti, Pt, Au, Ni, and combinations of these materials. For example, multiple layers of different metals may be deposited on top of one another. FIG. 3F shows a cross-sectional view of an example of a resulting workpiece.

According to further embodiments, a further photoresist material may be applied and patterned, followed by a galvanic process for forming first and, if needed, second contact posts (not shown in FIG. 3F). The first and second contact posts may each be made of nickel or copper. For example, the first and second contact posts may be produced by electroplating. Furthermore, multiple first and multiple second contact posts may be provided in each case. One or more contact posts may be provided for each contact element. Due to the special configuration of the first and second current spreading layers as described above, it is possible to connect the first and the second contact posts over a large surface area. This may reduce the thermal resistance and promote mechanical stability. If needed, a mold material, for example a potting compound made of plastic such as epoxy resin, may also be introduced between the contact posts and then ground back.

As has been described, the optoelectronic device may be produced in a simple manner. Due to the specific electrical connection of the first and second semiconductor layers, the number of rewiring levels may be reduced.

The optoelectronic semiconductor chip 11 may then be mounted onto a lead frame. For example, the optoelectronic semiconductor chip may be mounted directly on a lead frame. Then various potting materials may be applied, for example. According to further embodiments, the chip may also be mounted on a lead frame with a potting compound applied previously.

Figures 4A, 4B:
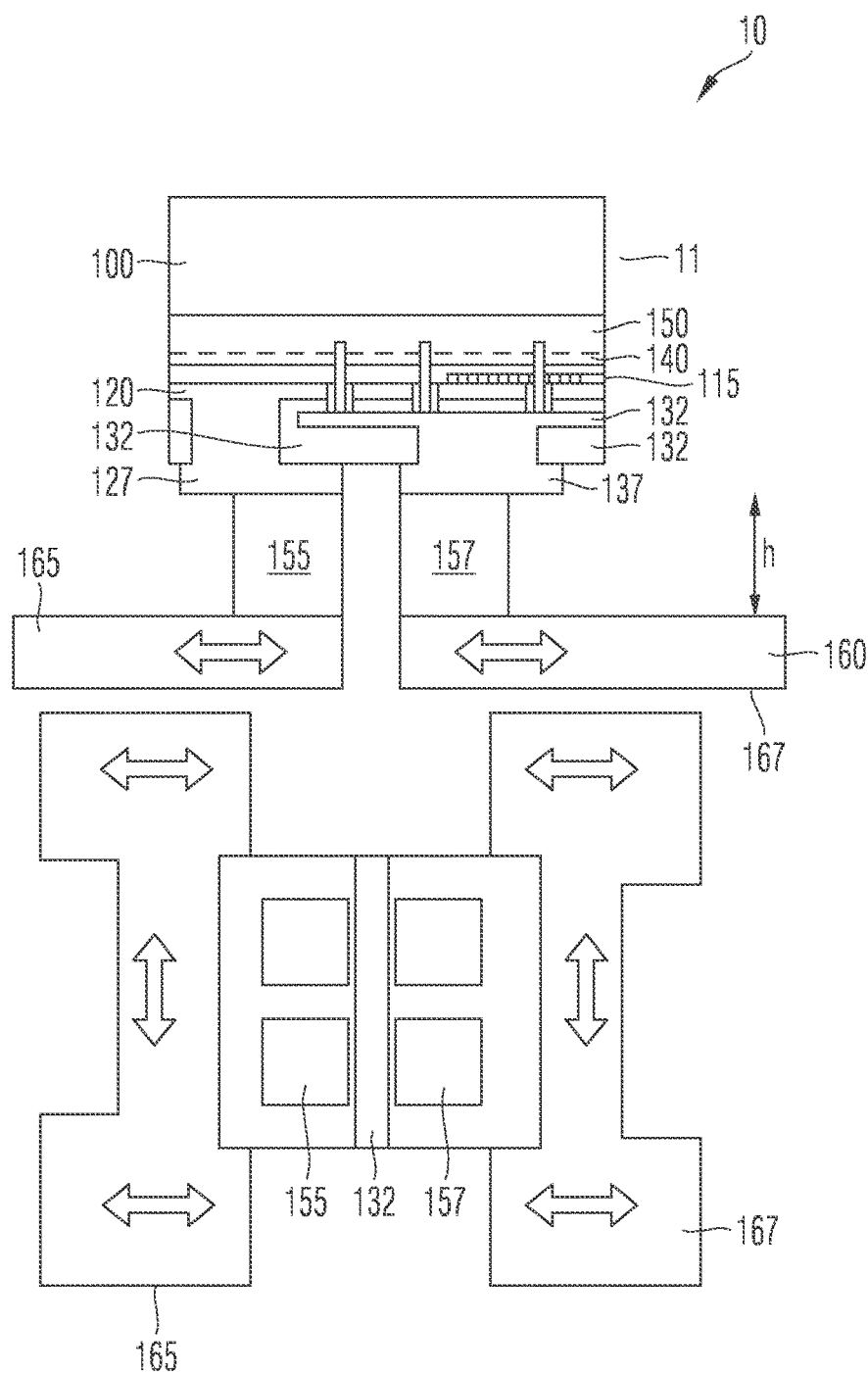
FIG. 4A shows a schematic cross-sectional view of an optoelectronic device according to embodiments.
FIG. 4B illustrates elements of the optoelectronic device according to embodiments.

FIG. 4A shows a schematic cross-sectional view of an optoelectronic device 10. An optoelectronic semiconductor chip 11, which may, for example, be configured as described with reference to FIG. 1A or 1B, is attached to a lead frame 160. In addition to the elements described with reference to FIGS. 1A and 1B, the optoelectronic semiconductor chip 11 may additionally include one or more first and second contact posts 155, 157. As an example, a first contact post 155 may be provided respectively on each first contact element 127. Furthermore, a second contact post 157 may be provided respectively on each second contact element 137. A lateral dimension of the contact posts 155, 157 may each be smaller than a lateral dimension of the contact elements 127, 137. The contact posts 155, 157 may have any desired cross-sectional shape, for example rectangular, square, circular or oval. As an example, a height h of the first and second contact posts 155, 157 may be 20 to 80 µm, for example 40 to 60 µm, for example 50 µm.

The lead frame 160 may comprise a first sub-element 165 and a second sub-element 167, wherein a connection is established between the first sub-element 165 and the first contact post or posts 155 of the optoelectronic semiconductor chip 11. Furthermore, a connection is established between the second sub-element 167 and the second contact post or posts 157 of the optoelectronic semiconductor chip 11. The arrows shown in FIG. 4A show temperature expansion effects that may occur, for example, when the semiconductor chip 11 is soldered onto the lead frame 160. As a result of the lead frame 160 being divided into two parts and comprising a first sub-element 165 and a second sub-element 167, any stress occurring may be compensated for in a suitable manner.

FIG. 4B shows a schematic top view of the first sub-element 165 and the second sub-element 167 and also of the first and second contact posts 155, 157. The semiconductor chip 11 comprises multiple first contact posts 155 and multiple second contact posts 157. These are isolated from one another by the insulating layer 132. As the semiconductor chip comprises multiple first contact posts 155 and multiple second contact posts 157, the mechanical stress may be reduced while the contact pad area remains the same. Furthermore, mechanical tension may be compensated. As the contact pad area remains roughly the same, heat dissipation may be maintained.

As shown in the schematic top view of the first and second contact posts 155, 157, multiple first and second contact posts may be implemented in an alternative configuration of the optoelectronic semiconductor chip as well. More precisely, the optoelectronic semiconductor chip may comprise a respective first and second contact element on the side of the optoelectronic semiconductor chip facing away from the light emission side. It is irrelevant in this case whether the first and second current spreading structures are formed in the manner described above. Furthermore, only one first and one second contact element may in particular also be provided. Consequently, the concepts described in FIGS. 4A to 4E may also be applied to flip-chip semiconductor chips comprising different configurations of the individual components.

Figure 4C:
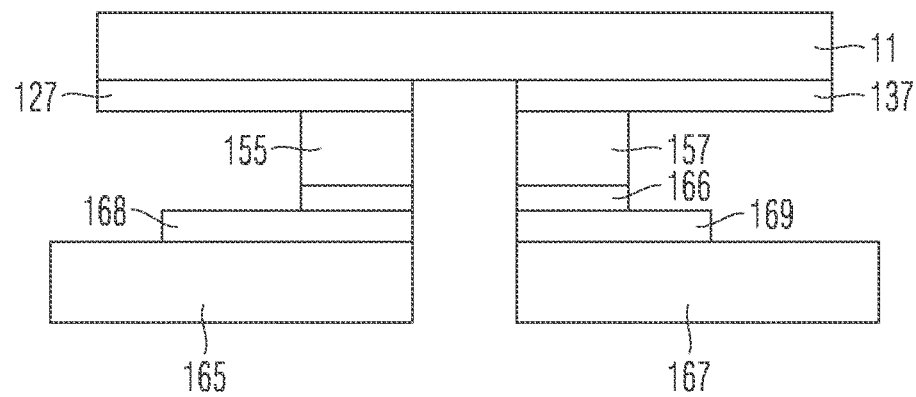
FIG. 4C illustrates further elements of the optoelectronic device according to embodiments.

FIG. 4C shows a schematic cross-sectional view of the optoelectronic semiconductor chip 11 comprising first and second contact elements 127, 137, first and second contact posts 155, 157, and first and second sub-elements 165, 167 of the lead frame 160. The different thermal expansion coefficient between the lead frame and the semiconductor chip causes severe bending, which in turn causes high stress that is transferred directly to the chip. This creates the risk of cracking and delamination. By using a first contact pad 168 and a second contact pad 169 directly in contact with the first sub-element 165 and the second sub-element 167, part of the stress may be compensated for. In particular, the first contact post 155 or the second contact post 157 may thereby be fastened in a more rigid manner. In this way, it is possible to distribute the stress over a large area. The stress may furthermore be buffered by selecting an appropriate solder material 166. This may prevent the stress from being transferred directly to the chip surface.

Figure 4D:
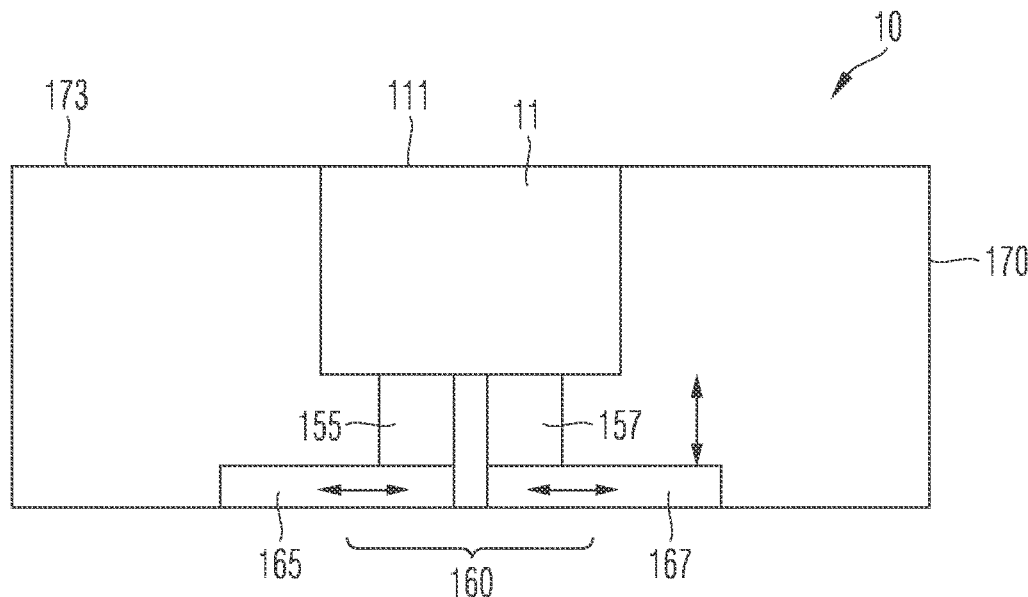
FIG. 4D shows a schematic cross-sectional view of an optoelectronic device according to further embodiments.

FIG. 4D shows a schematic cross-sectional view of an optoelectronic device 10 according to further embodiments. The optoelectronic semiconductor chip 11 mounted on a lead frame 160 is additionally encapsulated within a potting compound 170. The potting compound may, for example, be silicone, epoxy resin, or a hybrid material based, for example, on a silicone-epoxy mixture. The potting compound 170 may, for example, be arranged between the semiconductor chip 11 and the lead frame 160. The potting compound 170 may embed the semiconductor chip 11. A surface 173 of the potting compound 170 may be level with the light emission surface 111 of the semiconductor chip 11. For example, a surface 173 of the potting compound 170 and the light-emitting surface 111 of the optoelectronic semiconductor chip may jointly form a surface of the optoelectronic semiconductor device. As an example, the optoelectronic semiconductor chip 11 may initially be mounted on the lead frame 160, and the potting compound 170 may then be introduced.

Figure 4E:
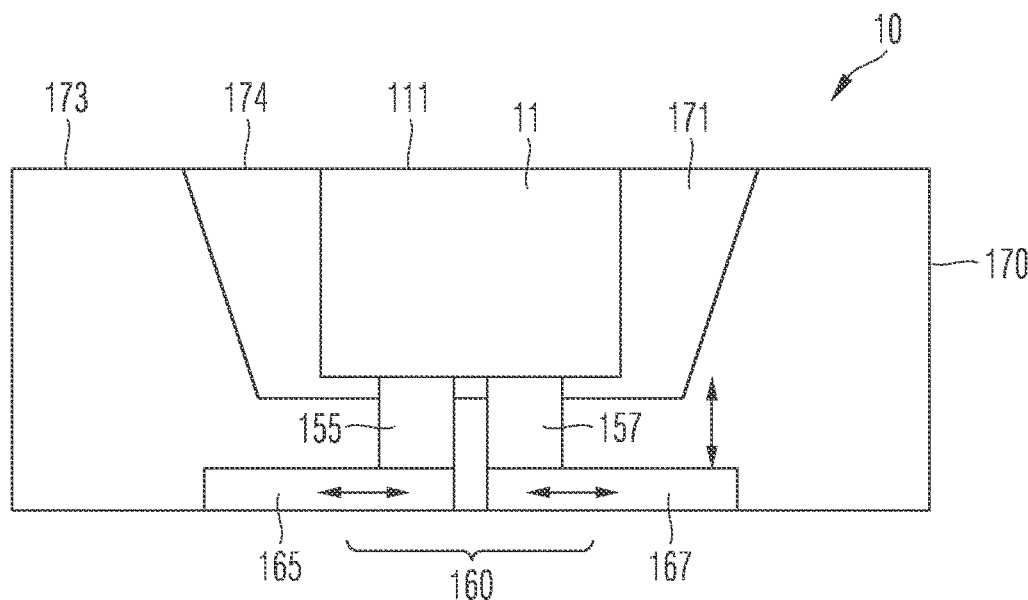
FIG. 4E shows a schematic cross-sectional view of an optoelectronic device according to further embodiments.
Figure 5A:
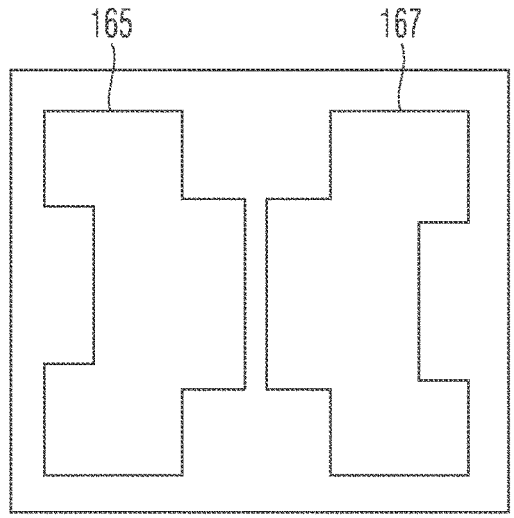
FIGS. 5A to 5D illustrate examples of lead frames of an optoelectronic device.
Figure 5B:
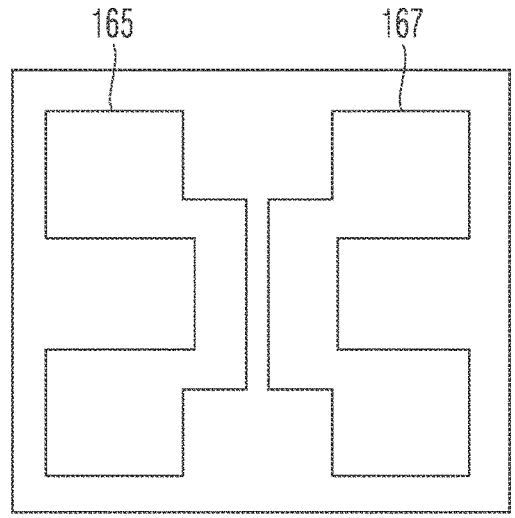
Figure 5C:
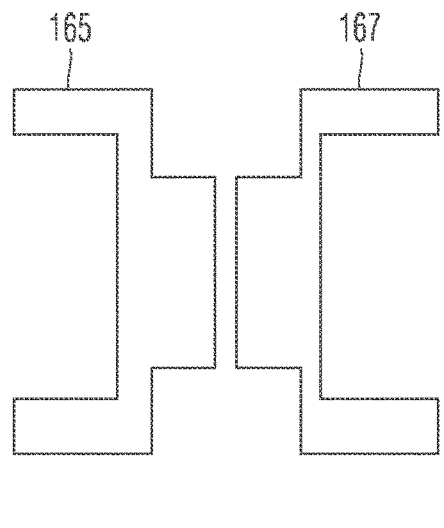
Figure 5D:
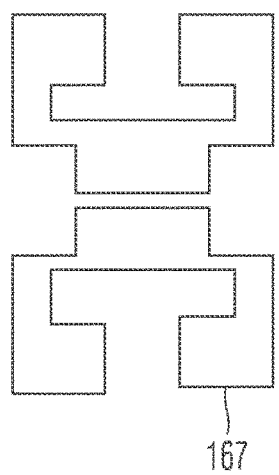

FIG. 4E shows a cross-sectional view of an optoelectronic device 10 according to further embodiments. In this case, too, the optoelectronic semiconductor chip 11 is mounted on a lead frame 160 and encapsulated with a potting compound 170. Furthermore, the optoelectronic semiconductor chip 11 is surrounded by a reflective potting compound 171. The reflective potting compound 171 may, for example, include $TiO_2$ as a reflective material. According to further embodiments, the reflective potting compound 171 may additionally include a converter material for converting the emitted light wavelength. As an example, the reflective potting compound 171, which optionally includes the converter material, may enclose the optoelectronic semiconductor chip 11 on all sides except for the light-emitting surface 111 of the semiconductor chip 11. In addition, the potting compound 170 may be arranged between the reflective potting compound 171 and the lead frame 160. The potting compound 170 may laterally enclose the reflective potting compound 171. As an example, a surface 173 of the potting compound 170, a surface 174 of the reflective potting compound 171, and the light-emitting surface 111 of the optoelectronic semiconductor chip may jointly form a surface of the optoelectronic semiconductor device. As an example, the optoelectronic semiconductor chip 11 may initially be mounted on the lead frame 160, and the reflective potting compound 171 and the potting compound 170 may then be introduced.

FIGS. 5A to 5D show various examples of the lead frame 160. The lead frame 160 comprises a respective first and second sub-element 165, 167. Different geometries, as shown in FIGS. 5A to 5D, may be implemented, for example, in order to provide efficient contacting, to dissipate heat in a favorable manner, and to continue to dissipate stress.

Figure 6:
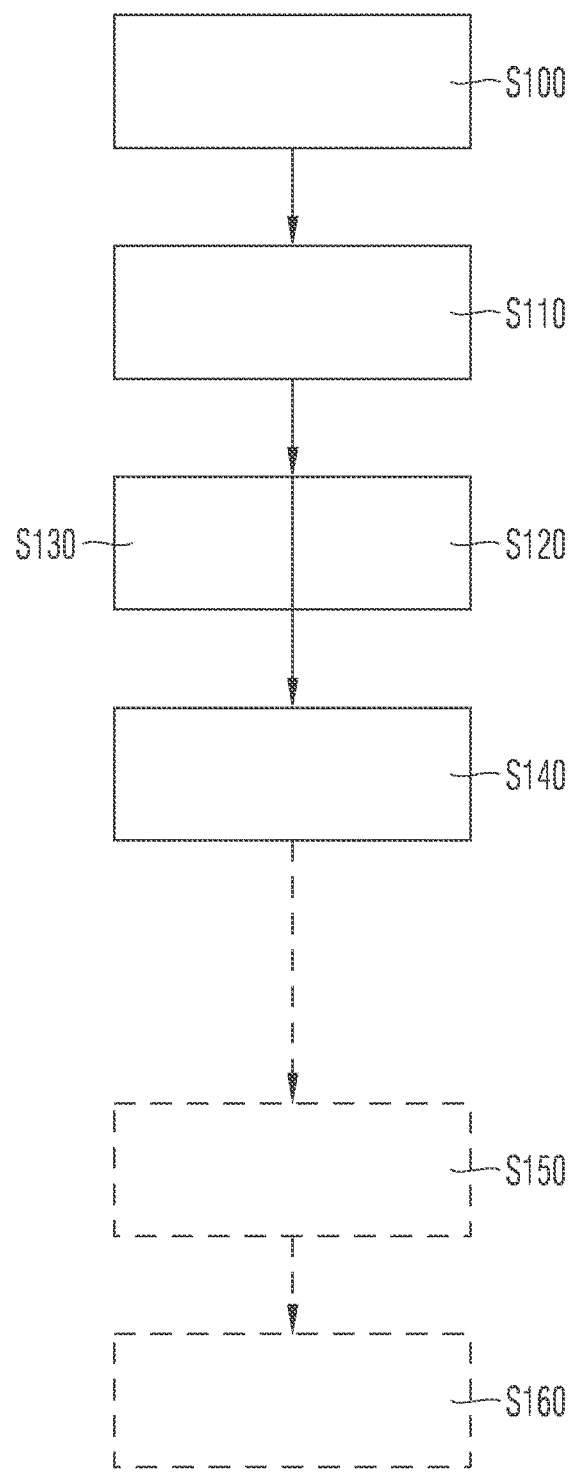
FIG. 6 outlines a method according to embodiments.

FIG. 6 outlines a method according to embodiments. As shown, a method for producing an optoelectronic device comprising an optoelectronic semiconductor chip which is suitable for emitting electromagnetic radiation comprises forming (S100) a layer stack which comprises a first semiconductor layer of a first conductivity type and a second semiconductor layer of a second conductivity type. The method further includes forming (S110) a dielectric mirror layer on a side of the first semiconductor layer facing away from the second semiconductor layer, forming (S120) a multiplicity of first electrical connecting elements that extend through the dielectric mirror layer, forming (S130) a plurality of second electrical connecting elements, and forming (S140) first and second current spreading layers, each on a side of the first semiconductor layer facing away from the second semiconductor layer. The dielectric mirror layer is arranged between the first semiconductor layer and the first current spreading layer. The plurality of first electrical connecting elements is suitable for electrically connecting the first semiconductor layer to the first current spreading layer. The plurality of second electrical connecting elements is suitable for electrically connecting the second semiconductor layer to the second current spreading layer.

The sequence of steps for forming the first and second electrical connecting elements is arbitrary and may be interchanged. Furthermore, the methods for forming the first and second connecting elements may comprise common method steps, for example etching or lithography methods. Furthermore, for example, the methods for forming a first current spreading layer and for forming the first connecting elements may include common method steps. Correspondingly, the methods for forming a second current spreading layer and for forming the second connecting elements may include common method steps. According to embodiments, the methods for forming the first current spreading layer and the second current spreading layer may include common method steps. Furthermore, they may include separate process steps that are carried out one after the other. According to further embodiments, forming the second connecting elements may also be omitted. As an example, the second current spreading layer may be connected to the second semiconductor layer in a manner other than via connecting elements.

The method may further include mounting (S150) the optoelectronic semiconductor chip onto a lead frame and applying (S160) a potting compound between the optoelectronic semiconductor chip and lead frame.

Although specific embodiments have been illustrated and described herein, those skilled in the art will recognize that the specific embodiments shown and described may be replaced by a multiplicity of alternative and/or equivalent configurations without departing from the scope of the claims. The application is intended to cover any adaptations or variations of the specific embodiments discussed herein. Therefore, the invention is to be limited by the claims and their equivalents only.

LIST OF REFERENCES 10 optoelectronic device
11 optoelectronic semiconductor chip
15 emitted electromagnetic radiation
100 substrate
101 first main surface of the substrate
103 mesa
105 conductive bonding layer
110 first main surface of the second semiconductor layer
111 light emission surface of the semiconductor chip
112 contact structure
115 dielectric mirror layer
116 first opening
117 second opening
120 first current spreading layer
121 first aluminum layer
122 second aluminum layer
125 first connecting element
127 first contact element
130 second current spreading layer
132 insulating layer
133 conductive filling
135 second connecting element
137 second contact element
140 first semiconductor layer
145 active zone
150 second semiconductor layer
155 first contact post
157 second contact post
160 lead frame
165 first sub-element
166 solder material
167 second sub-element
168 first contact pad
169 second contact pad
170 potting compound
171 reflective potting compound
173 surface of the potting compound
174 surface of the reflective potting compound

The invention claimed is:

1. An optoelectronic device comprising an optoelectronic semiconductor chip configured to emit electromagnetic radiation, wherein the optoelectronic semiconductor chip comprises:
a first semiconductor layer of a first conductivity type;
a second semiconductor layer of a second conductivity type;
first and second current spreading layers;
a dielectric mirror layer; and
a plurality of first electrical connecting elements and a plurality of second electrical connecting elements;
wherein:

the first semiconductor layer and the second semiconductor layer are stacked one on top of the other, and the first semiconductor layer is patterned to form a mesa;

the electromagnetic radiation emitted by the optoelectronic semiconductor chip is output via a first main surface of the second semiconductor layer;

the first current spreading layer is arranged on a side of the first semiconductor layer facing away from the second semiconductor layer;

the dielectric mirror layer is arranged between the first semiconductor layer and the first current spreading layer, and is further arranged over a mesa flank, covering the same;

the plurality of first electrical connecting elements extends through the dielectric mirror layer and are configured to electrically connect the first semiconductor layer to the first current spreading layer;

the second current spreading layer is arranged on a side of the first semiconductor layer facing away from the second semiconductor layer and is electrically connected to the second semiconductor layer via the plurality of second electrical connecting elements, and the number of first electrical connecting elements is greater than the number of second electrical connecting elements, wherein the second current spreading layer is arranged at a greater distance from the first semiconductor layer than the first current spreading layer, wherein the optoelectronic device further comprises first and second contact elements, wherein the first contact element is connected to the first current spreading layer, the second contact element is connected to the second current spreading layer, and the first and second contact elements are arranged on a side of the first semiconductor layer facing away from the second semiconductor layer, wherein the optoelectronic semiconductor chip further comprises a first contact post and a second contact post, wherein the first contact post is connected to the first contact element and the second contact post is connected to the second contact element, wherein the second contact element is arranged between the second contact post and the second current spreading layer.

2. The optoelectronic device according to claim 1, further comprising an active zone between the first and second semiconductor layers, the active zone being exposed in the region of the mesa flank.

3. The optoelectronic device according to claim 1, further comprising a transparent substrate arranged on the side of the second semiconductor layer.

4. The optoelectronic device according to claim 1, wherein the first current spreading layer and the second current spreading layer each form an interdigital structure, so that an interdigital structure of the first current spreading layer is arranged between interdigital structures of the second current spreading layer.

5. The optoelectronic device according to claim 1, wherein the second current spreading layer is part of a conductive carrier.

6. The optoelectronic device according to claim 1, further comprising a plurality of first contact elements or a plurality of second contact elements, respectively.

7. The optoelectronic device according to claim 1, further comprising a plurality of first contact posts or a plurality of second contact posts, respectively.

8. The optoelectronic device according to claim 1, further comprising a transparent conductive bonding layer in contact with the first semiconductor layer.

9. The optoelectronic device according to claim 1, wherein a distance between the first connecting elements is less than 100 µm.

10. The optoelectronic device according to claim 1, wherein a distance between the second connecting elements is less than 700 µm.

11. The optoelectronic device according to claim 1, further comprising a lead frame, wherein the optoelectronic semiconductor chip is mounted onto the lead frame.

12. A method for producing an optoelectronic device comprising an optoelectronic semiconductor chip configured to emit electromagnetic radiation, the method comprising:

forming a layer stack comprising a first semiconductor layer of a first conductivity type and a second semiconductor layer of a second conductivity type;

forming a dielectric mirror layer on a side of the first semiconductor layer facing away from the second semiconductor layer;

forming a plurality of first electrical connecting elements which extend through the dielectric mirror layer;

forming a plurality of second electrical connecting elements;

forming first and second current spreading layers, each on a side of the first semiconductor layer facing away from the second semiconductor layer, wherein the second current spreading layer is arranged at a greater distance from the first semiconductor layer than the first current spreading layer;

wherein:

the first semiconductor layer is patterned to form a mesa, the dielectric mirror layer is arranged between the first semiconductor layer and the first current spreading layer, and is further arranged over the mesa flank, covering the same, and the plurality of first electrical connecting elements is configured to electrically connect the first semiconductor layer to the first current spreading layer and the second current spreading layer is electrically connected to the second semiconductor layer via the plurality of second electrical connecting elements and the number of first connecting elements is greater than the number of second connecting elements, where the method further comprises:

forming first and second contact elements, wherein the first contact element is connected to the first current spreading layer, the second contact element is connected to the second current spreading layer, and the first and second contact elements are arranged on a side of the first semiconductor layer facing away from the second semiconductor layer, and wherein forming the optoelectronic semiconductor chip further comprises forming a first contact post and forming a second contact post, wherein the first contact post is connected to the first contact element and the second contact post is connected to the second contact element so that the second contact element is arranged between the second contact post and the second current spreading layer.

13. The method of claim 12, wherein forming the first connecting elements and the first current spreading layer comprises forming first openings in the dielectric mirror layer and forming a metallic layer.

14. The method according to claim 12, further comprising mounting the optoelectronic semiconductor chip onto a lead frame and applying an insulating potting compound between the optoelectronic semiconductor chip and the lead frame.

15. The method of claim 14, further comprising introducing a reflective element between the optoelectronic semiconductor chip and the potting compound.

16. The method according to claim 12, wherein the first current spreading layer is directly adjacent to the dielectric mirror layer.

17. The optoelectronic device according to claim 1, wherein the first current spreading layer is directly adjacent to the dielectric mirror layer.

18. The optoelectronic device according to claim 11, wherein the lead frame comprises a first sub-element and a second sub-element.

* * * * *